United States Patent [19]
Rubin

[11] 4,415,867
[45] Nov. 15, 1983

[54] HYBRID COUPLED MICROSTRIP AMPLIFIER

[75] Inventor: David Rubin, San Diego, Calif.

[73] Assignee: The United States of America as represented by the Secretary of the Navy, Washington, D.C.

[21] Appl. No.: 266,229

[22] Filed: May 22, 1981

[51] Int. Cl.³ .............................................. H03F 3/60
[52] U.S. Cl. ..................................... 330/287; 330/56; 333/116; 333/247
[58] Field of Search ...................... 330/53, 56, 57, 286, 330/287; 333/116, 247; 331/107 SL

[56] References Cited

U.S. PATENT DOCUMENTS

| | | | |
|---|---|---|---|
| 3,451,005 | 6/1969 | Skullestad | 330/53 X |
| 3,593,174 | 7/1971 | White | 330/53 |
| 3,631,358 | 12/1971 | Ayaki | 330/53 |
| 3,715,677 | 2/1973 | Vergnolle | 330/307 X |
| 3,775,694 | 11/1973 | Quine | 330/56 |
| 3,895,308 | 7/1978 | Lee et al. | 330/38 M |
| 3,952,262 | 4/1976 | Jamison | 330/53 X |
| 3,952,262 | 4/1976 | Jamison | 331/55 |
| 3,986,153 | 10/1976 | Kuno et al. | 330/287 X |
| 4,009,446 | 2/1977 | Koning et al. | 330/34 |
| 4,025,873 | 5/1977 | Chilluffo | 330/307 X |
| 4,086,543 | 4/1978 | Nigrin | 330/287 |

OTHER PUBLICATIONS

Entschladen et al., "Microstrip Transferred Electron Amplifier for X-Band Frequencies", *Nachrichtentechnische Zeitschrift NTZ*, vol. 29, No. 4, pp. 330-332, Apr. 1976.

Rubin, "Varactor-Tuned Millimeter-Wave MIC Oscillator", IEEE *Transactions on Microwave Theory and Techniques*, vol. MTT-24, No. 11, Nov. 1976, pp. 866,867.

*Primary Examiner*—James B. Mullins
*Attorney, Agent, or Firm*—Robert F. Beers; Ervin F. Johnston; Harvey Fendelman

[57] ABSTRACT

A microstrip integrated circuit reflection amplifier utilizing packaged diodes and permitting some gain and bandwidth adjustment. A 3 db quadrature coupler has two of its ports connected to substantially identical reflection amplifiers. The reflection diodes are adjustably mounted in brackets perpendicular to the dielectric substrate of the microstrip network and may be moved in and out along the microstrip circuit to provide for some gain correction and bandwidth adjustment.

10 Claims, 3 Drawing Figures

HYBRID COUPLED MICROSTRIP AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to the field of propagation of electromagnetic energy and more specifically to the field of electromagnetic energy amplifying systems and still more specifically to millimeter wave microstrip amplifiers.

In the past it has been the long-established practice to use ferrite circulators to separate the input and output radio frequency signals in devices utilizing diode reflection amplifiers. For frequencies above 30 GHz, Indium phosphide Gunn diodes have been shown to provide the best means for low noise wide-bandwidth amplification. For the past several years the U.S. Navy has been supporting contractor efforts at fabricating both the diodes and circuits towards this end. Generally, these Indium Phosphide amplifiers utilize the diodes in either coaxial or waveguide cavities which are circulator coupled to separate the input from the output. In the 26 to 40 GHz band circulator, deficiencies have been shown to limit the useful bandwidth to about 10 GHz. At frequencies above 40 GHz, circulators become much more limiting.

The use of circulators in diode reflection amplifier applications can be avoided by the use of 3 db quadrature couplers combined with waveguide amplifier stages. Such amplifiers, however, are much more bulky than the integrated circuit hybrid coupled amplifier described in the present application.

SUMMARY OF THE INVENTION

In accordance with the present invention, the foregoing disadvantages of the prior art are overcome by the use of 3 db quadrature couplers together with two identical diode amplifiers stages to separate the input from the output. Since waveguide couplers are fractions of a foot long and microstrip couplers are fractions of an inch long (at the above described frequencies), the advantage of the size reduction of the present invention should be readily apparent.

As is well known, ideal 3 db quadrature couplers have the property that when the coupled ports are terminated in the same impedance, all power not absorbed in these impedances is reflected back to the isolated port. This phenomenon is utilized in accordance with the present invention to implement a hybrid coupled microstrip amplifier. The microstrip amplifier of the present invention thereby avoids the use of circulators and enables the use of the new InP diode technology.

Further, it is an aspect of the present invention to utilize packaged diodes which can be easily removed and substituted, unlike other possible microstrip mountings which would require soldering of the diodes to the circuit. In this regard, a diode mount is fixed adjacent to the substrate of the microstrip amplifier of the present invention. This amplifier diode mounting permits the positions of the diodes to be adjusted on the microstrip circuit thereby providing at least some degree of gain correction and bandwidth adjustment.

OBJECTS OF THE INVENTION

Accordingly, it is the primary object of the present invention to disclose a millimeter wave microstrip amplifier which utilizes packaged diodes and does not use circulators.

It is a concomitant object of the present invention to disclose a millimeter wave microstrip amplifier that has the capability of gain correction and bandwidth adjustment.

It is another object of the present invention to disclose a microstrip millimeter wave amplifier which does not require soldering of the diode to the circuit.

It is still a further object of the present invention to disclose a millimeter wave microstrip amplifier that is much smaller than those available in the past.

DESCRIPTION OF THE PREFERRED EMBODIMENT

Figure 1:
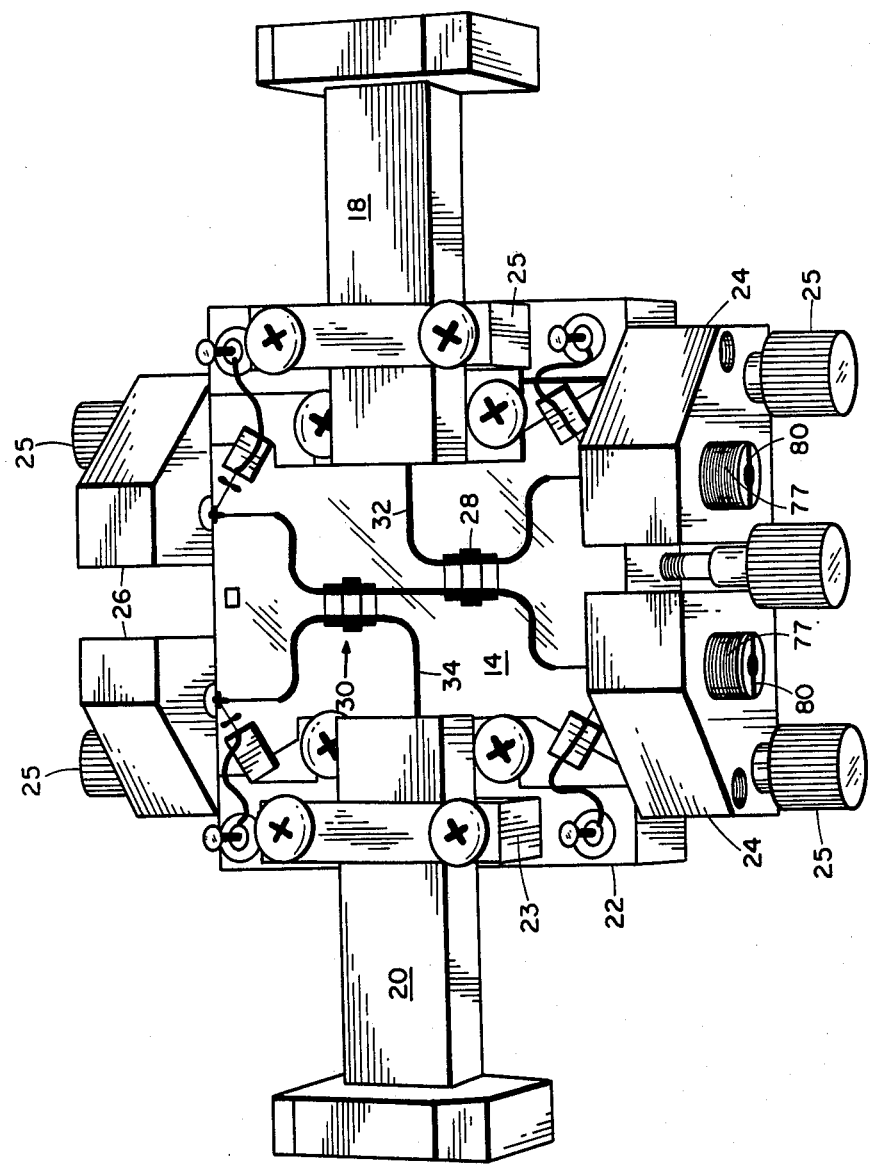
FIG. 1 is a perspective view of the microstrip amplifier of the present invention.
Figure 2:
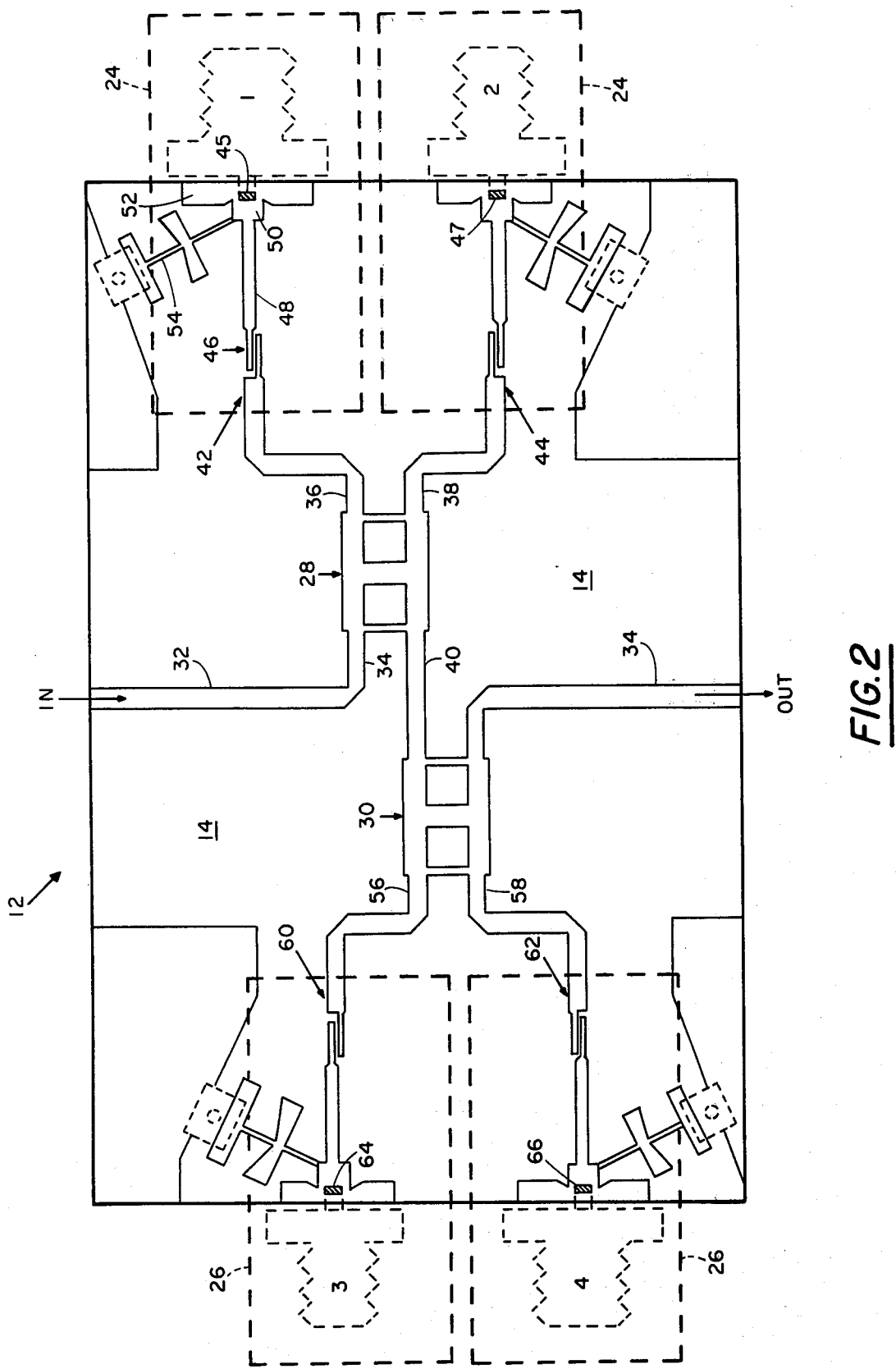
FIG. 2 is a top view of the microstrip amplifier of the present invention.

Referring now to FIG. 1 there is illustrated in isometric view the hybrid coupled microstrip amplifier of the present invention. For purposes of illustration of application of the present invention, both FIG. 1 and FIG. 2 illustrate the present invention with two amplifiers constructed in accordance with the teachings of the present invention, combined and connected on the same microstrip circuit board. The hybrid coupled microstrip amplifier 12 of the present invention is comprised of a dielectric circuit card 14 to which are attached the waveguide inputs and outputs and on which are formed the microstrip components in accordance with the present invention as will be described in detail below.

Waveguide to microstrip transition 18 carries the input radio frequency signal that is to be amplified by the hybrid coupled microstrip amplifier of the present invention. Output microstrip to waveguide transition 20 carries the amplified radio frequency signal from the amplifier of the present invention. Transitions 18 and 20 are securely affixed to the circuit mounting base 22 by means of mounting brackets 23 and 25. The underside of the circuit card 14 (not shown) is provided with a ground plane conductor as would be readily understood to those of ordinary skill in the art to which this invention pertains. Also affixed to the circuit mounting base 22 are diode mounting brackets 24 and 26 which comprise the holding mechanism for the reflection diodes of the present invention and also, as will be described, permit the adjustment of those reflection diodes. Knurl headed screws 25 secure the brackets 24 and 26 to the mounting base 22 and permit gross vertical and horizontal adjustment of the position of the diodes. Formed on the circuit card 14 is a first 3 db quadrature coupler 28 and a second 3 db quadrature coupler 30 to be described further below. Input transmission line 32 connects the input waveguide component 18 to the quadrature coupler 28 and output transmission line 34 couples the output of 3 db quadrature coupler 30 to the output waveguide 20.

Referring now to FIG. 2 the components formed on the top surface of the dielectric card 14 will now be described in detail. The quadrature coupler 28 which receives its input signal via transmission line 32 has an input port 34. The input furnished to the quadrature coupler 28 at port 34 is divided equally between two output ports of the coupler, 36 and 38. Likewise, any signal entering the coupler via port 36 is divided equally between the ports 34 and 40 of the 3 db quadrature coupler 28. Each output port 36 and 38 of the quadrature coupler 28 is connected to an identical matching network 42 and 44, respectively. These matching networks 42 and 44 together with the closely matched amplifier diodes 45 and 47 form identical reflection amplifier stages. Each matching network 42 and 44 is comprised of a DC block 46, one or more impedance transformers such as 48 and 50, and finally a stub section 52. RF bias filter 54 is connected between the transformer section 50 and a bias supply (not shown).

At the left end of the circuit card 14, as seen in FIG. 2, there is the 3 db quadrature coupler 30 having its output ports 56 and 58 connected via matching networks 60 and 62 to diodes 64 and 66, respectively. The components of the 3 db quadrature coupler 30 are identical to the 3 db quadrature coupler 28 previously described and, therefore, no further description is deemed necessary. Similarly, the components of the matching networks 60 and 62 as well as the matching network 44 are identical to the components of the matching network 42 previously described and, therefore, no further description is believed necessary.

Figure 3:
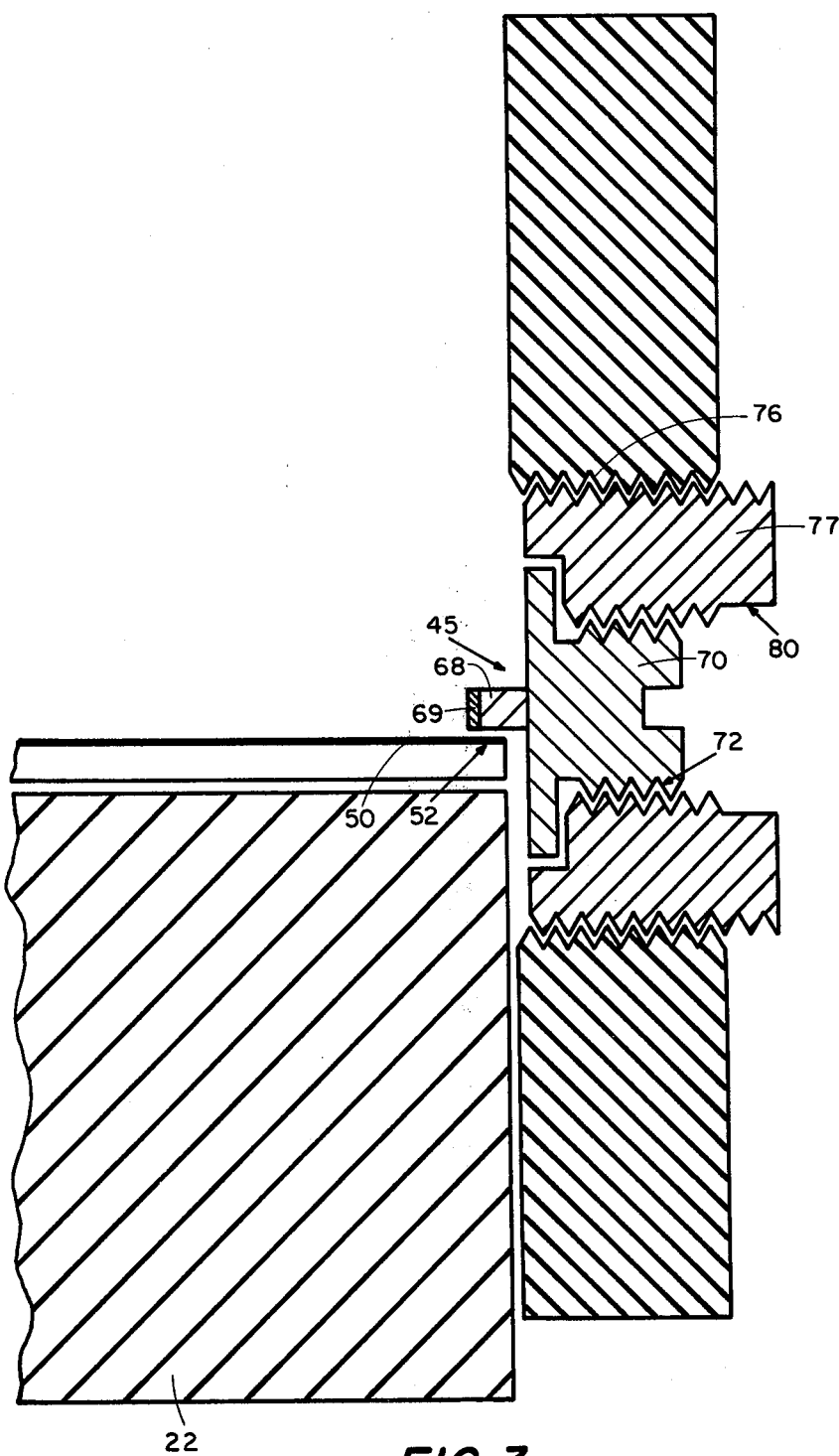
FIG. 3 is a side view of a horizontal mount for a packaged diode in accordance with the present invention.

Each of the reflection diodes 45, 47, 64 and 66 are substantially identical. As is illustrated in FIG. 3 the packaged diode 45 terminates in a cylindrical member 68 which contains the actual seminconductor terminating in metal cap 69. Further, the diode 45 is commercially provided with a base member 70 which has a male threaded portion 72. As illustrated in FIG. 3 the diode is contained in diode holder 77, which threads into the female threaded portions 76 of the diode mounting block 24. The degree to which the diode overlays section 50 is variable and adjustable by means of insertion of a screwdriver head into the slot 80 of diode holder 77. By so adjusting the position of the diode 45, the section of the transformer 52 behind the diode becomes an adjustable stub. This allows some degree of tuning of the microstrip amplifier of the present invention. Adequate heat transfer is always maintained because the diode package remains fixed in holder 77, even though its position on the microstrip line 52 is adjustable.

Referring now to FIG. 2 the operation of the device will now be described. The input RF signal entering the card 14 from transition 18 and propagating via transmission line 32 is divided equally from the input port 34 of the 3 db quadrature coupler 38 between the two output ports 36 and 38. As is well known, the signal appearing on output port 38 is phase shifted 90 degrees from the signal appearing on output port 36. The signal appearing on output port 36 propagates through matching section 42 and is amplified by the reflection diode 45. The reflected, amplified signal propagates back through the matching section 42 in the opposite direction and enters port 36 of the 3 db quadrature coupler 28. At this point the reflected, amplified signal appearing at port 36 is divided equally between the ports 34 and 40. Again, the signal appearing at port 40 is phase shifted 90 degrees from the signal appearing at port 34. Similarly, the portion of the input signal appearing on input transmission line 32 that was split to output port 38 of the quadrature coupler 28 propagates via matching section 44 to the reflection diode 47 where it is amplified and reflected back through the matching section 44 and back to the port 38. At this point, the signal reflected from amplifier diode 47 enters the port 38 and is divided equally between the ports 34 and 40. Again, the signal at port 34 is phase shifted 90 degrees from the signal at port 40.

The reflected, amplified RF power from each of the amplifier stages including amplifier diodes 45 and 47 is recombined at port 40 of the coupler 28. The portion of the signal reflected back from diode 47 to port 34, as should be readily understood, is 180 degrees out of phase from this signal reflected back from amplifier diode 45 to port 34. The two reflected signals appearing at port 34 thereby cancel, thus preventing feedback to the input. The output signal is the sum of the signals reflected back in phase to port 40 of the 3 db quadrature coupler 28. Thus, it is seen that the input signal appearing on transmission line 34 is amplified and reflected back to output 40 of quadrature coupler 28. The output of 40 may thus be taken as the output of the device or, as is illustrated in FIG. 2, may become the input to a second amplifier stage including the 3 db quadrature coupler 30. The operation of the 3 db quadrature coupler 30, the matching networks 60 and 62 and the amplifier reflection diodes 64 and 66 is identical to that previously described with respect to quadrature coupler 28, matching networks 42 and 44 and amplifier diodes 45 and 47. Thus, the signal entering 3 db quadrature coupler 30 from the output port 40 of the 3 db quadrature coupler is again reflected and amplified such that the reflected, amplified output signal appears on output transmission line 34 for utilization.

A hybrid coupled microstrip amplifier has thus been described in which the circuits are all in microstrip form. The diodes are packaged and mounted in blocks perpendicular to the microstrip circuit. The diodes are allowed to be adjusted somewhat within these blocks so that the contact position of the diodes along the final microstrip line is allowed to vary. This allows some degree of tuning as may be necessary to offset differences in diode characteristics and to provide for bandwidth adjustment and gain correction.

Obviously, many other modifications and variations of the present invention are possible in the light of the above teachings. It is therefore to be understood that within the scope of the appended claims the invention may be practiced otherwise than as specifically described.

What is claimed is:
1. A microstrip amplifier comprising:
a dielectric substrate having a top surface and a bottom surface;
a 3 db microstrip quadrature coupler disposed on said dielectric substrate top surface, said 3 db quadrature coupler having first, second, third and fourth ports, said first port comprising an input port and said second port comprising an output port;
a first reflection amplifier connected to said third port;
a second reflection amplifier connected to said fourth port, said second reflection amplifier being substantially identical to said first reflection amplifier;
said first reflection amplifier being connected to said third port by a first microstrip DC filter;

said second reflection amplifier being connected to said fourth port by a second microstrip DC filter;

first and second microstrip transformer sections each connecting one of said first and second microstrip DC filters to its respective reflection amplifier; and first and second microstrip stub sections, each being connected to one of said first and second microstrip transformer sections.

2. The microstrip amplifier of claim 1 wherein said first and second reflection amplifiers comprise packaged diodes.

3. The microstrip amplifier of claim 2 wherein said packaged diodes are Gunn diodes.

4. The microstrip amplifier of claim 1 wherein said first and second microstrip DC filters are parallel coupled filters.

5. The microstrip amplifier of claim 1 wherein said first and second reflection amplifiers each comprise a diode cap member mounted on a base member.

6. The microstrip amplifier of claim 5 wherein each said diode base member has a male threaded portion.

7. The microstrip amplifier of claim 5 or 6 wherein said first and second reflection amplifiers are adjustably positioned adjacent said dielectric substrate such that the longitudinal axes of said amplifiers is parallel to said dielectric substrate.

8. The microstrip amplifier of claim 1 further comprising:

a first mounting bracket adjacent said dielectric substrate within which said first reflection amplifier is adjustably mounted such that said first reflection amplifier may be variably positioned over one of said microstrip stub sections.

9. The microstrip amplifier of claim 8 further comprising:

a second mounting bracket adjacent said dielectric substrate within which said second reflection amplifier is adjustably mounted such that said second reflection amplifier may be variably positioned over the other one of said microstrip stub sections.

10. A microstrip amplifier comprising:

a dielectric substrate having a top surface and a bottom surface;

a first 3 db microstrip quadrature coupler disposed on said dielectric substrate top surface, said first 3 db quadrature coupler having first, second, third and fourth ports, said first port comprising an input port and said second port comprising an output port;

a second 3 db microstrip quadrature coupler disposed on said dielectric substrate top surface, said second 3 db quadrature coupler having first, second, third and fourth ports, said second 3 db quadrature coupler first port comprising an input port and being connected to said first 3 db quadrature coupler second port, and said second 3 db microstrip quadrature coupler having a second port comprising an output port;

a first reflection amplifier connected to said first 3 db microstrip quadrature coupler third port;

a second reflection amplifier connected to said first 3 db microstrip quadrature coupler fourth port, said second reflection amplifier being substantially identical to said first reflection amplifier;

a third reflection amplifier connected to said second 3 db microstrip quadrature coupler third port;

a fourth reflection amplifier connected to said second 3 db microstrip quadrature coupler fourth port, said third reflection amplifier being substantially identical to said fourth reflection amplifier;

said first reflection amplifier being connected to said first 3 db microstrip quadrature coupler third port by a first microstrip DC filter;

said second reflection amplifier being connected to said first 3 db microstrip quadrature coupler fourth port by a second microstrip DC filter;

said third reflection amplifier being connected to said second 3 db microstrip quadrature coupler third port by a third microstrip DC filter;

said fourth reflection amplifier being connected to said second 3 db microstrip quadrature coupler fourth port by a fourth microstrip DC filter;

first, second, third and fourth microstrip transformer sections each connecting one of said first, second, third and fourth microstrip DC filters to its respective reflection amplifier; and first, second, third and fourth microstrip stub sections each connected to one of said first, second, third and fourth microstrip transformer sections.

* * * * *